US008560903B2

(12) United States Patent  
Wang et al.

(10) Patent No.: US 8,560,903 B2  
(45) Date of Patent: Oct. 15, 2013

(54) SYSTEM AND METHOD FOR EXECUTING FUNCTIONAL SCANNING IN AN INTEGRATED CIRCUIT ENVIRONMENT

(75) Inventors: Zhiyuan Wang, Fremont, CA (US); Xinli Gu, Sunnyvale, CA (US); Zhanglei Wang, Fremont, CA (US); Hongxia Fang, Durham, NC (US)

(73) Assignee: Cisco Technology, Inc., San Jose, CA (US)

( * ) Notice: Subject to any disclaimer, the term of this patent is extended or adjusted under 35 U.S.C. 154(b) by 545 days.

(21) Appl. No.: 12/873,135

(22) Filed: Aug. 31, 2010

(65) Prior Publication Data

US 2012/0053924 A1   Mar. 1, 2012

(51) Int. Cl.  
*G01R 31/28* (2006.01)

(52) U.S. Cl.  
USPC ............................ 714/726; 714/731; 714/744

(58) Field of Classification Search  
USPC ........................ 714/724, 726, 731, 741, 744  
See application file for complete search history.

(56) References Cited

U.S. PATENT DOCUMENTS

| | | | |
|---|---|---|---|
| 4,258,421 A | 3/1981 | Juhasz et al. | |
| 4,270,174 A | 5/1981 | Karlin et al. | |
| 4,463,418 A | 7/1984 | O'Quin, II et al. | |
| 4,517,468 A | 5/1985 | Kemper et al. | |
| 4,695,946 A | 9/1987 | Andreasen et al. | |
| 4,823,914 A | 4/1989 | McKinney et al. | |
| 4,937,763 A | 6/1990 | Mott | |
| 4,970,725 A | 11/1990 | McEnroe et al. | |
| 4,977,390 A | 12/1990 | Saylor et al. | |
| 5,107,500 A | 4/1992 | Wakamoto et al. | |
| 5,113,489 A | 5/1992 | Cihiwsky et al. | |
| 5,123,017 A | 6/1992 | Simpkins et al. | |
| 5,274,572 A | 12/1993 | O'Neill et al. | |
| 5,282,127 A | 1/1994 | Mii | |
| 5,321,837 A | 6/1994 | Daniel et al. | |
| 5,329,465 A | 7/1994 | Arcella et al. | |
| 5,400,018 A | 3/1995 | Scholl et al. | |
| 5,422,890 A | 6/1995 | Klingsporn et al. | |
| 5,442,553 A | 8/1995 | Parrillo | |
| 5,445,347 A | 8/1995 | Ng | |
| 5,995,915 A | 11/1999 | Reed et al. | |

(Continued)

OTHER PUBLICATIONS

Goessel, M.; Sogomonyan, E.S., "Code disjoint self-parity combinational circuits for self-testing, concurrent fault detection and parity scan design," VLSI Test Symposium, 1994. Proceedings., 12th IEEE , vol., No., pp. 151,157, Apr. 25-28, 1994.*

(Continued)

*Primary Examiner* — Cynthia Britt  
(74) *Attorney, Agent, or Firm* — Patent Capital Group (57) ABSTRACT

An example method is provided and includes executing a functional test for an integrated circuit and observing a failure associated with the integrated circuit. The method also includes executing a functional scan mode in order to reproduce the failure associated with the integrated circuit. A functional state of the integrated circuit is locked when the failure occurs, and the functional state is subsequently recovered for a structure test for the integrated circuit. In more particular embodiments, particular states of the functional test are evaluated and compared against other states associated with a model circuit that did not experience any failure in order to identify a latest cycle of the integrated circuit that could trigger the failure and an earliest cycle of the integrated circuit that could observe the failure.

20 Claims, 5 Drawing Sheets

(56) References Cited

U.S. PATENT DOCUMENTS

| | | | |
|---|---|---|---|
| 6,324,665 | B1 | 11/2001 | Fay |
| 6,567,933 | B1 * | 5/2003 | Swoboda et al. ............... 714/31 |
| 7,100,084 | B2 | 8/2006 | Unkle et al. |
| 7,171,586 | B1 | 1/2007 | Gross et al. |
| 7,171,589 | B1 | 1/2007 | Urmanov et al. |
| 7,487,058 | B2 | 2/2009 | Gross et al. |
| 7,610,173 | B2 | 10/2009 | Gross et al. |
| 7,844,861 | B2 * | 11/2010 | Hegarty et al. ............... 714/46 |
| 7,958,408 | B2 * | 6/2011 | de Obaldia et al. ........... 714/715 |
| 2001/0005821 | A1 | 6/2001 | Ottosson |
| 2002/0175697 | A1 | 11/2002 | Miller et al. |
| 2003/0216890 | A1 | 11/2003 | Gross et al. |
| 2004/0078634 | A1 | 4/2004 | Gilstrap et al. |
| 2008/0115014 | A1 | 5/2008 | Vaidyanathan |
| 2008/0228462 | A1 | 9/2008 | Gross et al. |
| 2009/0106600 | A1 | 4/2009 | Gross et al. |
| 2010/0070232 | A1 * | 3/2010 | Fritz et al. ..................... 702/124 |
| 2011/0314335 | A1 * | 12/2011 | Tanaka ............................ 714/33 |
| 2012/0066548 | A1 * | 3/2012 | Barker et al. ................... 714/28 |

OTHER PUBLICATIONS

Hongxia Fang; Zhiyuan Wang; Xinli Gu; Chakrabarty, K., "Mimicking of Functional State Space with Structural Tests for the Diagnosis of Board-Level Functional Failures," Test Symposium (ATS), 2010 19th IEEE Asian, vol., No., pp. 421,428, Dec. 1-4, 2010.*

Roman Trobec and Izidor Jerebic, "Optimization of Diagnostic Examination," University of Ljubljana, Jozef Stefan Institute, Ljubljana, Slovenia, retrieved from Google Scholar and printed Aug. 9, 2010, 12 pages.

USPTO Feb. 19, 2013 Notice of Allowance from U.S. Appl. No. 13/042,153.

U.S. Appl. No. 13/042,153, filed Mar. 7, 2011, entitled "System and Method for Providing Adaptive Manufacturing Diagnoses in a Circuit Board Environment,"Investors: Zhiyuan Wang.

Mullerheim, Steven, San Francisco Bay Area Rapid Transit District, "Adaptive Diagnostic System, Project Final Report Transit Idea Project 2, Transit Idea Program Transportation Research Board National Research Council," Aug. 31, 1998, pp. 1-35.

* cited by examiner

SYSTEM AND METHOD FOR EXECUTING FUNCTIONAL SCANNING IN AN INTEGRATED CIRCUIT ENVIRONMENT

TECHNICAL FIELD

This disclosure relates generally to the field of circuit testing and, more particularly, to executing functional scanning in an integrated circuit environment.

BACKGROUND

No Trouble Found (NTF) is a term used primarily in the electronics industry referring to a system or component that has been returned to the manufacturer, supplier, or distributor due to some failure, but that fails to exhibit the failure to the original manufacturer. For example, a product may be returned for replacement or for service repair, but the product may operate properly when tested. This situation can also be referred to as No Defect Found (NDF). NTF returns can erode profit margins for manufacturers and service providers. The time, materials, and shipping costs in exchanging hardware are significant in relation to the cost of the item being replaced. Further, NTF returns can also indicate that customer problems have not been resolved: reducing customer satisfaction and eroding brand value. As a general proposition, effectively addressing these problematic testing issues presents a significant challenge to equipment vendors, electronics suppliers, and system designers alike.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Overview

An example method is provided and includes executing a functional test for an integrated circuit and observing a failure associated with the integrated circuit. The method also includes executing a functional scan mode in order to reproduce the failure associated with the integrated circuit. A functional state of the integrated circuit is locked when the failure occurs, and the functional state is subsequently recovered for a structure test for the integrated circuit. In more particular embodiments, particular states of the functional test are evaluated and compared against other states associated with a model circuit that did not experience any failure in order to identify a latest cycle of the integrated circuit that could trigger the failure and an earliest cycle of the integrated circuit that could observe the failure.

In yet other embodiments, the method can include utilizing a clock control a state recover element in order to transfer a state associated with the model circuit into the integrated circuit being tested. Partitioning can be executed in order to identify particular intervals in which the failure occurs. In still other embodiments, the method can include executing failure searching in order to identify appropriate time intervals in which the failure can be observed. In addition, a trigger state can be identified that caused the failure associated with integrated circuit. In more specific implementations, the method can include performing a diagnosis based on fault models developed in conjunction with executing the functional scan mode for the integrated circuit. The functional test power and noise conditions can also be reproduced for the structure test for the integrated circuit.

Example Embodiments

Figure 1:
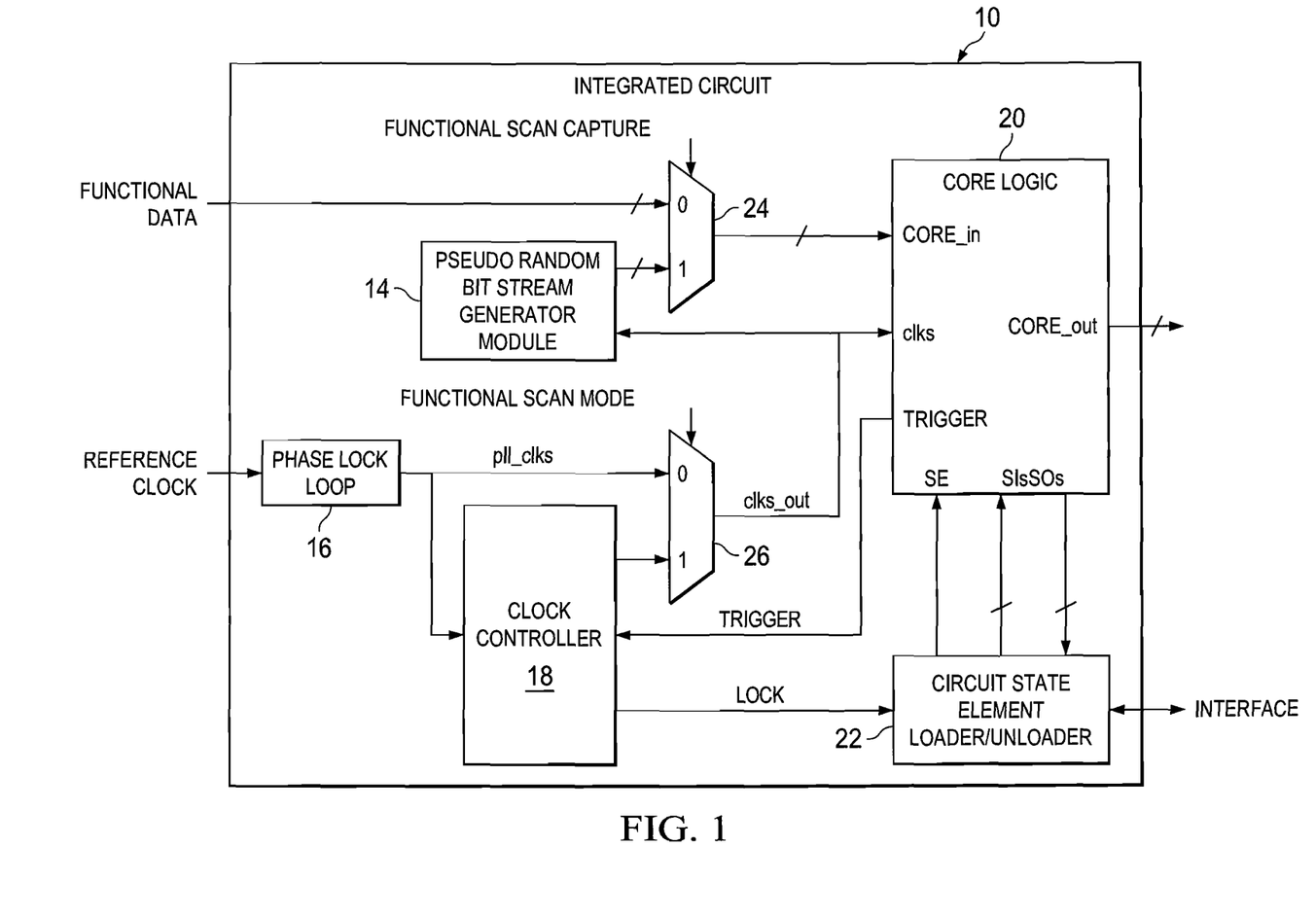
FIG. 1 is a simplified block diagram of a system for executing functional scanning in an integrated circuit environment in accordance with one embodiment of the present disclosure.

Turning to FIG. 1, FIG. 1 is a simplified block diagram illustrating an integrated circuit 10 for which functional scanning can be executed in accordance with one embodiment. Integrated circuit 10 can be configured to perform any electronic activity associated with numerous potential device applications. Integrated circuit 10 may include a functional data input and a reference clock input, as shown in FIG. 1. Integrated circuit 10 may also include a pseudo-random bit stream (PRBS) generator module 14 and a phase lock loop (PLL) 16. In general terms, PLL 16 represents a control mechanism that attempts to generate an output signal whose phase is related to the phase of the input reference signal. PRBS module 14 can be configured to mimic behaviors for testing purposes (e.g., mimicking functional traffic data, or packet data in cases where integrated circuit 10 is involved in routing applications). This data can subsequently be used to recreate certain testing conditions for optimally diagnosing failure issues, as detailed below.

Integrated circuit 10 may also include a clock controller 18, a core logic 20, and a circuit state loader/unloader element 22, which may connect to any type of suitable interface (e.g., a Joint Test Action Group (JTAG) interface). Additionally, integrated circuit 10 may include any number of logic gates 24 and 26. Logic gates 24 and 26 can be any suitable logic element that receives the functional data (e.g., a 2-1 multiplexer (mux) element). In operational terms, and with respect to logic gate 24, when the signal is 0, functional data is received, where if the signal is 1, then PRBS generator module 14 provides the input data. Similarly, and in regards to logic gate 26, if the signal is 0, then a reference clock can provide input data, while if the signal is 1, then clock controller 18 would provide the appropriate data. Core logic 20 may include core input and core output pathways, as is illustrated. In addition, core logic 20 may include a scan enable (SE), scan inputs (SIs), and scan outputs (SOs): all of which may interface with circuit state loader/unloader element 22. Circuit state loader/unloader element 22 can include logic state loading and memory state loading.

Note that for purposes of discussion, it is important to understand the common issues encountered in testing environments associated with integrated circuit 10. The following foundational information may be viewed as a basis from which the present disclosure can be properly explained. Chip suppliers (e.g., Texas Instruments, IBM, etc.) manufacture integrated circuits to be included in various types of devices, components, equipment, etc. As part of their quality control measures, these companies can execute structural tests, which can evaluate memory components, logic, etc. (i.e., referred to as component level tests). Subsequently, those chips are sent to a different company that assembles circuit boards, which include these manufactured electronics. The circuit boards can then be deployed in any suitable electronic device, component, or appliance.

Once the circuit board has been completed, it can be provisioned in a given device. At this juncture, there is a second round of testing that evaluates the functional aspects of the circuit board (i.e., referred to as system level tests). For example, if the resultant device is a router, then the functional test may include routing packets through the circuit board of the router. If this functional test fails, then the chip can be sent back to the supplier, who may not be able to replicate the error. This results in a No Trouble Found (NTF) condition.

The term NTF in such a context connotes that a component fails in system or board tests, but that passes testing when returned to the manufacturer or supplier for warranty, replacement, or service repair. This inconsistency creates unwanted lag time (e.g., several months of debugging, returning electronic devices, etc.) for the engineers involved. Aside from design complexity, the key challenge to debug NTF is that it is difficult to identify the exact failing moment, and subsequently lock and reproduce the failure state for debugging. Taking this analysis one step further, even if the supplier can reproduce the functional test failure, it is hard to recover and port the functional test into a vendor automatic-test-equipment (ATE) test program. This recover and port activity is important for ultimately resolving the failure problem.

In some cases, structural tests oversimplify their activities (e.g., where few cycles are used to test functional aspects of the associated integrated circuit). It would be better to bring a circuit closer to its functional state and, subsequently, use the structural test to reproduce a failure in the structural test mode. In one generic sense, the objective is to convert the functional test failure into a structural test failure. An NTF can be observed during a functional test and this can be mapped to a structural test such that a supplier of the chip can readily identify the underlying problem. From this point, not only can the supplier understand the error condition, but also take remedial actions such that future errors for these chips can be avoided.

As a general proposition, there is no current methodology to intelligently correlate a functional failure with a structural test failure. Most debugging work is ad hoc and lacking of any systematic debugging protocol. This results in higher costs for individuals involved in the manufacturing of electronic products. For example, in integrated circuit applications, the parts failed on functional tests have to be replaced after assembly. However, in many cases, an incorrect replacement occurs, which further lengthens the product delivery timeline.

In accordance with certain teachings of the present disclosure, integrated circuit 10 offers a board/system level test and diagnosis methodology that bridges the functional test and structural test results. A failing functional test state can be replicated using designated hardware. The methodology can leverage the benefits of a structural test (which is often deterministic, repeatable, easy to control, etc.) to reproduce the functional test failures. Note that the term 'reproduce' as used herein is meant to connote any type of mimicking, replication, or imitation (either in part, or in full) of any characteristic, condition, or parameter associated with the integrated circuit environment (e.g., its state, condition, etc.). By providing an intelligent design associated with clock controller 18 and circuit state recovering activities (e.g., involving circuit state loader/unloader element 22), the methodology can mimic the functional test condition (i.e., for power consumption, noise, etc.). Moreover, the system can attempt to reproduce the functional test failure and, further, perform diagnosis under a deterministic test mode.

In operation, integrated circuit 10 can effectively reproduce and diagnose functional test failures (including the NTF issues) using a structural test approach. This can intelligently bridge the gaps between functional testing and structural testing. Also, in the context of certain embodiments, an on-the-fly system level diagnosis can be achieved by integrated circuit 10. Additionally, integrated circuit 10 can offer a deterministic way to reproduce a functional test (or close to a functional test) accompanied by a fault activation condition. This includes reproducing the functional test power and noise condition: instead of a cycle-by-cycle based structural test approach. Existing methodology focuses exclusively on either a functional test or a structural test. In contrast, the present disclosure can leverage the advantage of both functional test (i.e., functional mode) and structural test (i.e., deterministic test and diagnosis).

In terms of applications, such a methodology can apply to a broad range of devices, scenarios, protocols, etc. For example, in the context of board/system environments, the following general activities can occur as part of the testing protocol: 1) repeat functional failure using structure test; 2) bridge functional and structural test; 3) execute structural test under close to functional mode condition (power, di/dt, noise, etc.); and 4) replicate the root cause NTF issue. In regards to the failure analysis, a correlation can be made between the functional test failure and the structural test failure. Also, an identification can be made for the functional test failing state and the marginal defects. Lastly, structural test vectors can be provided to the vendor side to resolve the marginal defects identified.

Note that the operations of the present disclosure can improve and reduce the number of defective manufactured parts from suppliers. Additionally, the root cause NTF can be identified before shipping the product to a customer. Also, the silicon failure analysis (FA) time can be significantly reduced. In general, the teachings of the present disclosure can also provide better diagnostic support for integrated circuit manufacturers by providing a deterministic approach to lock, load, and unload a functional test state. Hence, a given integrated circuit vendor can be provided with a structural failing pattern to screen the marginal defect parts. Additionally, the features of the present disclosure provide both boundary-scan control and central processing unit (CPU) based control. In sum, these benefits can yield higher device quality, lower device cost, and reduce the board and system NTF debugging time and efforts. Before turning to additional operations associated with integrated circuit 10, the example infrastructure of FIG. 1 is further detailed.

Clock controller 18 can be configured to have precise controllability of start and stop clocks. The On/Off of clock pulses can be triggered by any user-defined event such as an error correction code (ECC) failure, a packet drop, a test fail, etc. In addition, for multiple clock domain designs, clock controller 18 can provide the flexibility for a user to allow for adjustments with respect to the clock phase and the latency relationships. This can be done in order to mimic the functional test clock relationship. This technique may be important for the functional scan methodology. Clock controller 18 can be programmed in such a way that, upon receiving the trigger signal, it can still provide functional clock pulses (e.g., millions of cycles) before stopping and locking the circuit state. This can enable the circuit to still operate at (or close to) a functional mode such that the failure triggered by the functional test can be reproduced under the functional scan test mode. By using a searching algorithm (which can be provisioned within core logic 20, circuit state loader/unloader element 22, or any other appropriate location within [or external to] integrated circuit 10), the failure moment can be quickly identified such that a root cause of the failure becomes easily identified. In essence, the circuit state is effectively locked and recovered for any associated logic gate (e.g., flip-flops), memories, etc.

In operation, the trigger within core logic 20 is user configurable. For example, the trigger can be associated with packet loss or packet dropping in the case of routing applications. The trigger is effectively communicated to clock controller 18, which can accurately track the number of cycles associated with a given time duration. Clock controller 18 can use the trigger event to lock a certain circuit state, which can effectively be delivered to circuit state loader/unloader element 22. The circuit state can be used for debugging such that the failure can be easily reproduced.

Circuit state loader/unloader element 22 can offer the capability to load the memory contents to nearly match that which would be provided by the functional mode. Subsequently, circuit state loader/unloader element 22 can provide the observation capability to unload the memory contents for failure analysis and for diagnosis purposes. Also, this circuitry can be used to reproduce or to mimic the functional test power and the noise conditions to provide a more stressful test condition for a structural test. In one instance, the objective of this circuitry can be to achieve the best test condition correlation between a functional mode and a structural test mode.

In operation of one example testing scenario, integrated circuit 10 converts a functional test failure to a structural test failure. This means the functional test failure can be reproduced in a structural deterministic environment and, therefore, it becomes easier to debug/diagnose the failure root cause with the existing design for test (DFT)/built-in self-test (BIST) structures implemented in many application specific integrated circuits (ASICs). To achieve certain objectives, the following techniques can be implemented.

First, integrated circuit 10 can lock the functional state when tests do fail. This typically can include multiple states of the targeted circuit passing before the test fails at some juncture. The states of integrated circuit 10 can be determined by the contents in memories, flip-flops, I/O pins of each device, etc. Second, a recovering occurs for the state locked and for the memories, flip-flops, and I/O pins for a structural based debug test. Third, the values for the states that were not locked (when functional test failed) are constrained. Fourth, the test failure is reproduced in a controlled deterministic environment.

Each of above four activities identified above are supported by any number of detailed hardware implementations (some of which are detailed in the ensuing FIGURES). By way of example (where other possibilities are clearly within the broad scope of the present disclosure), a summary of possible hardware implementations is listed below. Each hardware implementation can be associated with a related technique. Details of each implementation are subsequently explained.

Turning first to the lock functional state, the hardware implementation can include a clock controller, a memory content load/unload, and an embedded logic analyzer module (ELAM). Next, for a recover functional state activity, the hardware implementation can include a clock controller, a memory content load/unload, an ELAM, a circuit state dump. For a constraint circuit state, the hardware implementation can include a clock controller, a memory content load/unload, an ELAM, a circuit state dump, and a PRBS generator. For the reproducing of a failure in structural test environment, the hardware implementation can include a clock controller, a memory content load/unload, an ELAM, a circuit state dump, and a PRBS generator.

Figure 2:
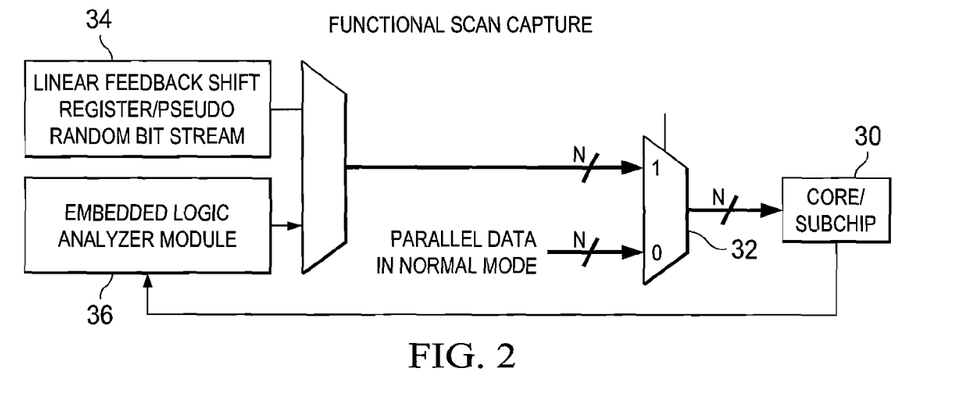
FIG. 2 is a simplified block diagram of a system associated with executing functional scanning in an integrated circuit environment in accordance with one embodiment of the present disclosure.

Referring now to FIG. 2, FIG. 2 is a simplified block diagram illustrating one example instance associated with an integrated circuit in which various mechanisms are being used to produce or to mimic the functional state. FIG. 2 includes a linear feedback shift register/pseudo-random bit stream (LFSR/PRBS) 34 being used in conjunction with an ELAM 36. This particular scenario involves a parallel data set in a normal mode, where a logic gate 32 (e.g., a 2-to-1 mux) is illustrated as interacting with a core/subchip 30.

Note that ELAM 36 is simply a design choice, which can be viable for certain functional mode testing and debugging. ELAM 36 can store the circuit state for a previous number of cycles, as well as provide the pass/fail trigger signals. The functional scan can reuse its capability to store and to recover the circuit state for the functional mode. Also, ELAM 36 can provide the trigger for clock controller 18 to stop the clock for failure analysis purposes.

In regards to the circuit state dump, such a technique can be used to load and unload the circuit state using a scan structure, where such operations can focus on loading the contents of a given flip-flop used in functional and structural test modes. In combining this data with memory contents load/unload, the system effectively targets an effective recovery for the memory and the flip-flop contents for failure analysis. Such a technique can essentially provide better observability rather than a functional test, which normally has limited observation points (such as control status registers (CSRs)).

LFSR/PRBS 34 can be configured to reproduce the randomness of the package, data IO, and the average power/noise condition. Using a weighted PRBS mechanism, the system can mimic the desired switching activity as well (or it can mimic other desired activities based on particular needs). LFSR/PRBS 34 can also be used to generate the random IO or circuit state constraints for test and diagnosis purposes. Similarly, the LFSR component can serve the same purposes, depending on different hardware implementation requirements, overhead, and/or particular design needs.

As an overview with respect to FIG. 2, the architecture can perform the pure functional test and observe the failure. Clock controller 18 can be suitably programmed, and appropriate software can be used to lock/recover failure circuit states. In cases where the functional stimulus is hard to provide under component level testing, the PRBS/LFSR/ELAM components can be used to mimic the functional state. In general terms, depending on the different testing methodology and debugging mode, any of the ELAM/PRBS/LFSR components may be used to reproduce or to mimic the functional state.

Figure 3:
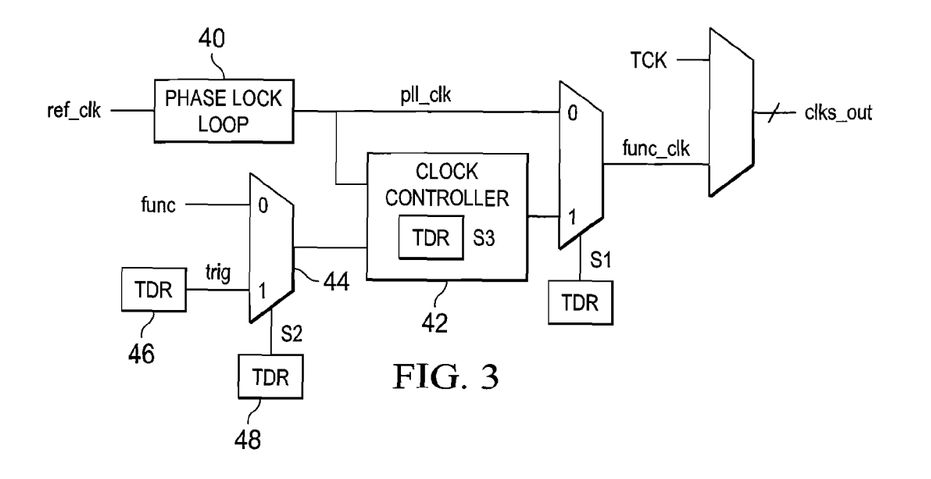
FIG. 3 is another simplified block diagram of a system associated with executing functional scanning in an integrated circuit environment in accordance with one embodiment of the present disclosure.

FIG. 3 is a simplified block diagram illustrating another example implementation associated with the operations of the present disclosure. In this particular example, FIG. 3 illustrates a number of logic gates, some of which may be a 2-to-1 mux. The logic gates appropriately interface with a PLL 40 and a clock controller 42. Additionally, a 2-1 mux 44 is also provided, where this element offers an input to clock controller 42. A set of TDRs 46 and 48 also interface with mux 44.

Figure 4:
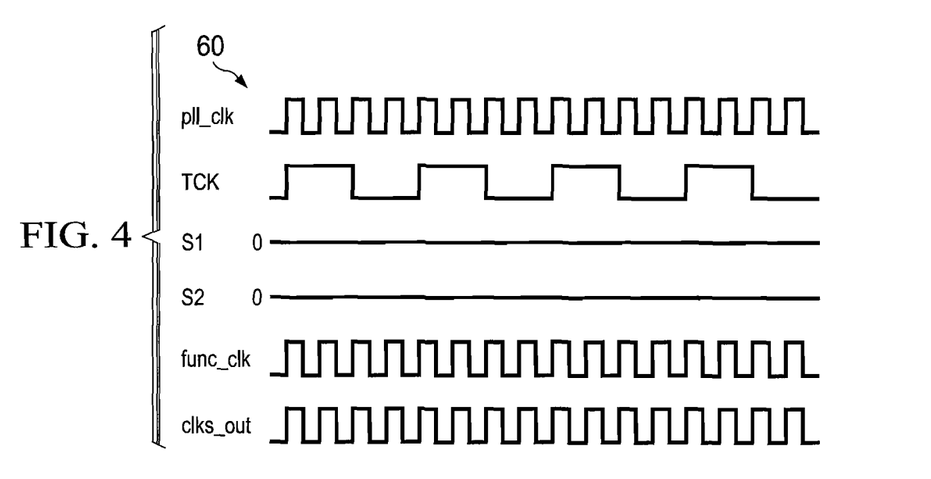
FIGS. 4-6 are simplified flow diagrams related to the system in accordance with one embodiment of the present disclosure.
Figure 5:
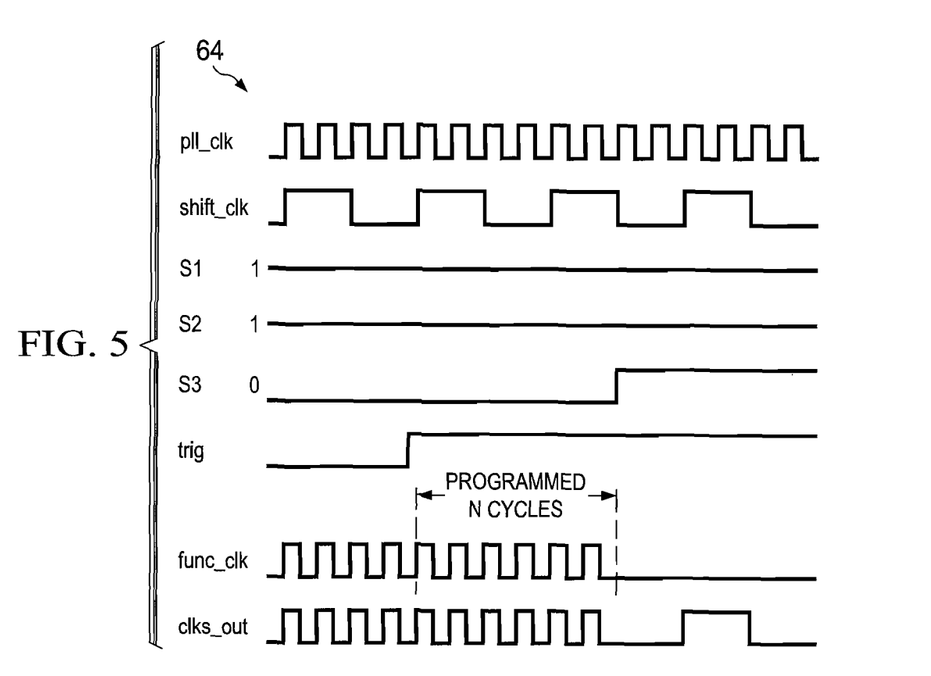
Figure 6:
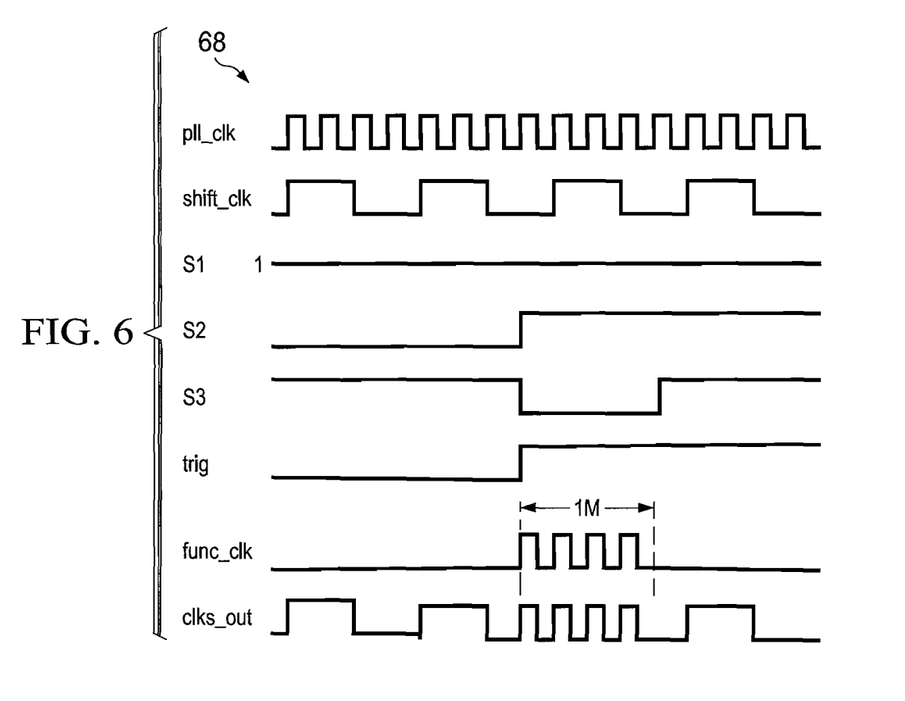

FIGS. 4-6 are simplified timing diagrams illustrating the three example modes discussed herein for the debugging activities. FIG. 4 shows a timing diagram 60 for the functional test mode. In this particular test mode, both S1 and S2 equal 0. FIG. 5 illustrates another timing diagram 64 associated with a functional scan mode under a functional test condition: S1=1, S2=1, S3=0, trig=1, count N cycles→stop→state dump. FIG. 6 illustrates another timing diagram 68 associated with a pure functional scan mode. In this third mode, the pure functional scan relates to the following parameters: S1=1, S3=1(clock stop)→state dump→S3=0 (clock on), trig=1, S2=1→run N cycles→stop→state dump.

Semantically, and in the context of the operational aspects of the present disclosure, to achieve test and diagnosis efficiency, a software or an automatic tool can be used. This automatic tool can use the golden board/system (i.e., a model circuit) and bad board/system to run the same tests and then compare the circuit state for the interested area/logic/memory of the component. By applying the lock and recover techniques discussed herein, the tool can automatically perform the test to narrow down the faulty stages and/or cycles. Additionally, structural-based diagnosis can then be conducted to identify a root cause of the failure mechanism.

For the functional scan test flow, there can be certain assumptions made for a given architecture. For example, in certain embodiments, there can be an assumption that the ASICs and components under test passed their structural tests. Subsequently, after assembling the parts into the board/system, some of the functional tests may have failed. In the most common example, there could be boards/systems that passed the designated tests. An assumption is also made that there is a golden ASIC/board/system available (i.e., a model circuit) that passes the targeted functional test. The basis for this assumption is that, if all the ASIC/board/systems are failing the functional test, the supplier and/or customer may need to check the object under test with the hardware specification to see if the desired behavior has been designed properly.

Figure 7:
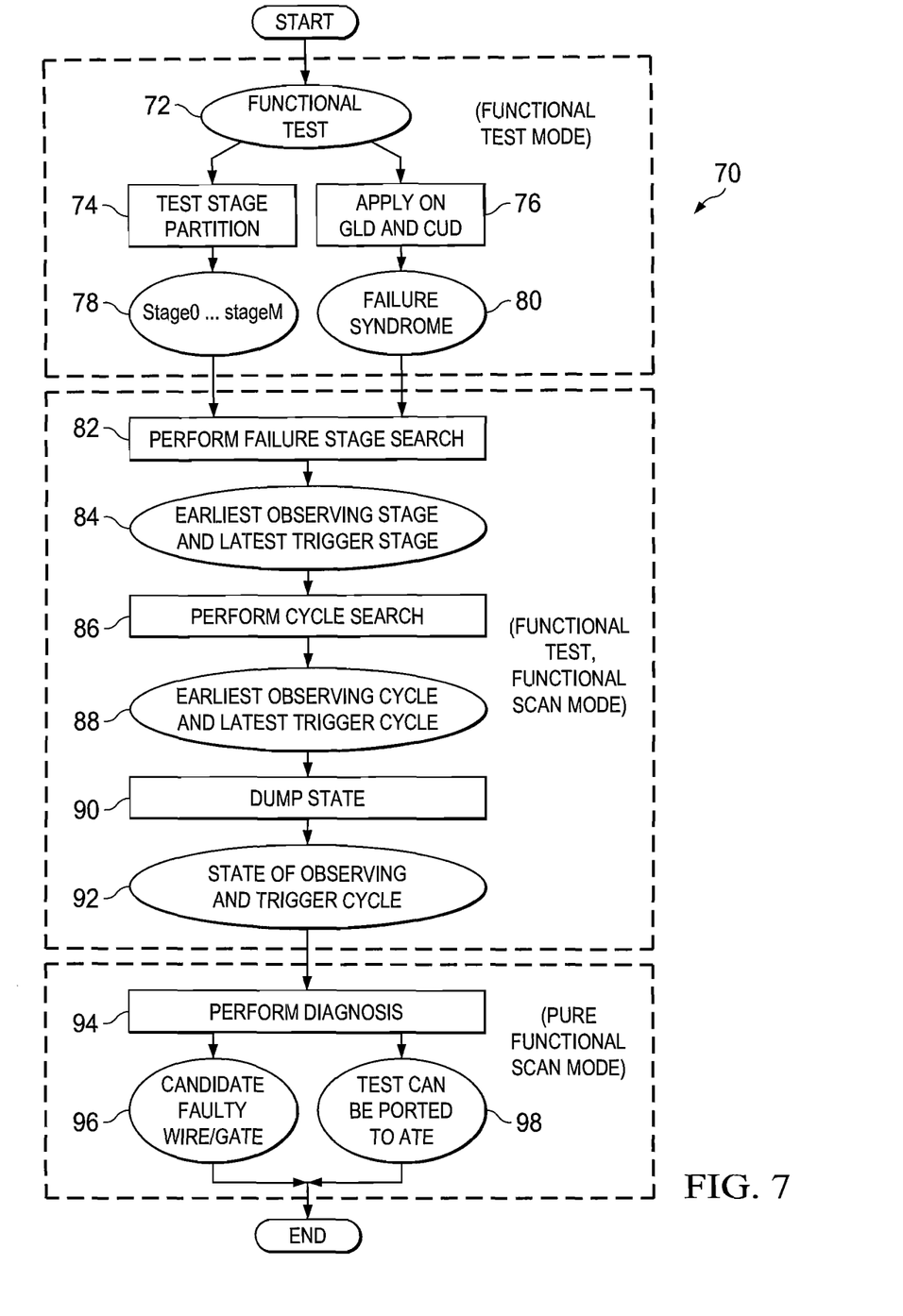
FIG. 7 is a simplified flowchart related to the system in accordance with one embodiment of the present disclosure.

Moving to FIG. 7 in order to further detail possible activities associated with the present disclosure, FIG. 7 is a simplified flowchart 70 associated with one example set of operations of the present disclosure. For purposes of discussion, the golden ASIC/board/system is abbreviated as GLD, while the failing ASIC/system/board is abbreviated as CUD (circuit under diagnosis). There are three general methods of operation being depicted by the hatched boxes of FIG. 7. The three modes include a functional test mode, a functional test/functional scan mode, and a pure functional scan mode.

A functional test block 72 is the initial starting point for this particular flow, where a test stage partition block 74 is subsequently provided. The functional testing is applied on the GLD and the CUD at block 76. The stages are identified at block 78, and a failure syndrome (represented as block 80) is also identified from the functional testing. In this particular example, in performing the functional test, the GLD passed the test, but the CUD failed the functional test.

At this juncture, the operation switches to the second type of mode: functional test, functional scan mode. At block 82, a failure stage search is performed. Note that the switch to the functional scan test mode involves a clock control, and the circuit state preload enabled for the GLD and the CUD. At block 84, the earliest observing stage and latest trigger stage are identified. In essence, the functional tests are divided into multiple stages, where the architecture performs a failure stage search on the CUD for given test. This result is then compared (i.e., compare the test results with the results collected from GLD). The purpose of this step is to find a latest stage that could trigger the failure, and the earliest stage that can observe the failure syndrome. The previously discussed lock and recover techniques can be used.

Returning to FIG. 7, at block 86, a cycle search is performed, while in block 88 an earliest observing cycle and a latest trigger cycle are also identified. At block 90, the dump state is executed, and at block 92 the state of the observing and the trigger cycle are identified. Note that once the trigger stage and the observe stage are identified, the clock control circuitry can be enabled after restoring the circuit state. In certain examples, search algorithms (e.g., binary search), can be used in this step to locate a latest cycle, which could trigger the failure and the earliest cycle that could observe the failure. The search space/results can also be based on different fault models. Clock control logic, state recover, and constrain circuitry can be used for dumping the state from the GLD, and then loading the GLD state into the CUD.

The operation then moves to the last mode, which is the pure functional scan mode. At block 94, a diagnosis is performed for the circuit. More specifically, once the failing cycles are narrowed down, the diagnosis is performed based on targeting fault models and the state of trigger/observed cycles. At block 96, the candidate circuit is flagged as having a faulty wire/gate, or any other possible failure conditions. The architecture can then port the results (i.e., the resultant repeatable functional scan test) into an automatic test equipment (ATE) test. Hence, the test can be ported to any suitable next destination, as is being illustrated by block 98.

Note that in certain example implementations, some of the various functions or processes outlined herein may be implemented by logic encoded in one or more tangible media (e.g., embedded logic and logic gates provided in an application specific integrated circuit (ASIC)), digital signal processor (DSP) instructions, or software or firmware (potentially inclusive of object code and source code) to be executed by a processor, or other similar machine, etc.). Any memory element (e.g., provided as part of circuit state loader/unloader element 22) can store data used for the various operations outlined herein.

This includes a memory element being able to store software, logic, code, and/or processor instructions that can be executed to carry out the activities or code execution described or discussed in this Specification. A processor (or collection of logic gates) can execute any type of instructions associated with the data to achieve the operations detailed herein in this Specification. In one example, a processor could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA)), an erasable programmable read only memory (EPROM), an electrically erasable programmable ROM (EEPROM)) or an ASIC that includes digital logic, software, code, electronic instructions, or any suitable combination thereof.

In one example implementation, integrated circuit 10 can include software in order to achieve the intelligent testing functions discussed herein. Integrated circuit 10 can similarly include memory elements to be used in achieving intelligent testing functions discussed herein. Integrated circuit 10 may further keep information in any suitable memory element (random access memory (RAM), ROM, EPROM, EEPROM, ASIC, etc.), software, hardware, or in any other suitable component, device, element, or object where appropriate and based on particular needs. Any possible memory items (e.g., database, table, cache, etc.) should be construed as being encompassed within the broad term memory element. Similarly, any of the potential processing elements, modules, and machines described in this Specification should be construed as being encompassed within the broad term processor.

Note that with the examples provided herein, interaction may be described in terms of two or three elements. However, this has been done for purposes of clarity and example only. In certain cases, it may be easier to describe one or more of the functionalities of a given set of flows by only referencing a limited number of integrated circuit and/or processor elements. It should be appreciated that the present disclosure (and its teachings) are readily scalable and can accommodate any number of devices or flows, as well as more complicated/sophisticated arrangements and configurations. Accordingly, the examples provided herein should not limit the scope or inhibit the broad teachings of the present disclosure as potentially applied to a myriad of other architectures.

It is also important to note that the steps discussed with reference to FIGS. 1-7 illustrate only some of the possible scenarios that may be executed by, or within, the present disclosure. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by the present disclosure in that any suitable arrangements, chronologies, configurations, and timing mechanisms may be provided without departing from the teachings of the present disclosure.

Although the present disclosure has been described in detail with reference to particular embodiments, it should be understood that various other changes, substitutions, and alterations may be made hereto without departing from the spirit and scope of the present disclosure. Virtually any configuration that seeks to intelligently control testing operations could enjoy the benefits of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims.

What is claimed is:

1. A method, comprising:
   executing a functional test for an integrated circuit;
   observing a failure associated with the integrated circuit; and
   executing a functional scan mode in order to reproduce the failure associated with the integrated circuit, wherein a functional state of the integrated circuit is locked when the failure occurs, and wherein the functional state is subsequently recovered for a structure test for the integrated circuit.

2. The method of claim 1, wherein particular states of the functional test are evaluated and compared against other states associated with a model circuit that did not experience any failure in order to identify a latest cycle of the integrated circuit that could trigger the failure and an earliest cycle of the integrated circuit that could observe the failure.

3. The method of claim 2, further comprising:
   utilizing a clock control a state recover element in order to transfer a state associated with the model circuit into the integrated circuit being tested.

4. The method of claim 1, wherein partitioning is executed in order to identify particular intervals in which the failure occurs.

5. The method of claim 1, further comprising:
   executing failure searching in order to identify appropriate time intervals in which the failure can be observed, wherein a trigger state that caused the failure associated with integrated circuit is identified.

6. The method of claim 1, further comprising:
   performing a diagnosis based on fault models developed in conjunction with executing the functional scan mode for the integrated circuit.

7. The method of claim 1, wherein functional test power and noise conditions are reproduced for the structure test for the integrated circuit.

8. Non-transitory computer readable media that includes code for execution and when executed by a processor perform operations comprising:
   executing a functional test for an integrated circuit;
   observing a failure associated with the integrated circuit; and
   executing a functional scan mode in order to reproduce the failure associated with the integrated circuit, wherein a functional state of the integrated circuit is locked when the failure occurs, and wherein the functional state is subsequently recovered for a structure test for the integrated circuit.

9. The media of claim 8, wherein particular states of the functional test are evaluated and compared against other states associated with a model circuit that did not experience any failure in order to identify a latest cycle of the integrated circuit that could trigger the failure and an earliest cycle of the integrated circuit that could observe the failure.

10. The media of claim 9, the operations further comprising:
    utilizing a clock control a state recover element in order to transfer a state associated with the model circuit into the integrated circuit being tested.

11. The media of claim 8, wherein partitioning is executed in order to identify particular intervals in which the failure occurs.

12. The media of claim 8, the operations further comprising:
    executing failure searching in order to identify appropriate time intervals in which the failure can be observed.

13. The media of claim 8, the operations further comprising:
    performing a diagnosis based on fault models developed in conjunction with executing the functional scan mode for the integrated circuit.

14. The media of claim 8, wherein functional test power and noise conditions are reproduced for the structure test for the integrated circuit.

15. An apparatus, comprising:
    an integrated circuit that includes a clock controller coupled to core logic and to a circuit state element, wherein the apparatus is configured to:
    execute a functional test for an integrated circuit;
    observe a failure associated with the integrated circuit; and
    execute a functional scan mode in order to reproduce the failure associated with the integrated circuit, wherein a functional state of the integrated circuit is locked when the failure occurs, and wherein the functional state is subsequently recovered for a structure test for the integrated circuit.

16. The apparatus of claim 15, wherein particular states of the functional test are evaluated and compared against other states associated with a model circuit that did not experience any failure in order to identify a latest cycle of the integrated circuit that could trigger the failure and an earliest cycle of the integrated circuit that could observe the failure.

17. The apparatus of claim 16, wherein the clock controller and the circuit state element are used to transfer a state associated with the model circuit into the integrated circuit being tested.

18. The apparatus of claim 15, wherein partitioning is executed in order to identify particular intervals in which the failure occurs.

19. The apparatus of claim 15, wherein the apparatus is further configured to:
   execute failure searching in order to identify appropriate time intervals in which the failure can be observed.

20. The apparatus of claim 15, the apparatus being further configured to:
   perform a diagnosis based on fault models developed in conjunction with executing the functional scan mode for the integrated circuit, wherein functional test power and noise conditions are reproduced for the structure test for the integrated circuit.

* * * * *